Jan. 2, 1968 D. KAHNG ET AL 3,360,851

SMALL AREA SEMICONDUCTOR DEVICE

Filed Oct. 1, 1965

INVENTORS D. KAHNG
R. M. RYDER

BY H. W. Lockhart

ATTORNEY

United States Patent Office 3,360,851 Patented Jan. 2, 1968

3,360,851

SMALL AREA SEMICONDUCTOR DEVICE

Dawon Kahng, Somerville, and Robert M. Ryder, Summit, N.J., assignors to Bell Telephone Laboratories, Incorporated, New York, N.Y., a corporation of New York Filed Oct. 1, 1965, Ser. No. 491,907
6 Claims. (Cl. 29—590)

ABSTRACT OF THE DISCLOSURE

The method of making external contact to extremely small area semiconductor devices, by means of laying down in a single slice of semiconductor an array of identical active regions, mutually electrically isolated from one another, and randomly contacting one of them with an external wire.

Figure 1:
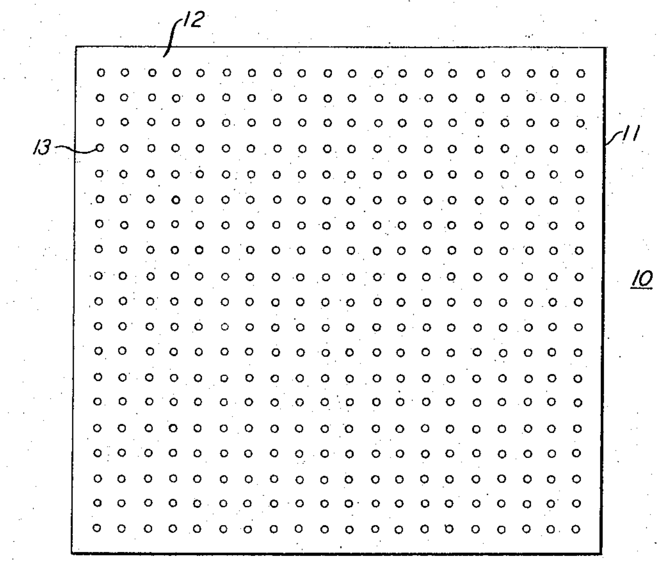

This invention relates to semiconductor devices and particularly to semiconductor devices having very small active areas to which external connection is made.

Semiconductor technology, particularly oxide masking and metal plating, has progressed in recent years to the point where semiconductor devices, and in particular diodes, can be fabricated with PN junction diameters comparable to those of point contact diodes. However, for very high frequency use, these junctions or other active zones must be connected to a circuit with leads that add little inductance and essentially zero parasitic capacitance. Insofar as applicants are aware, this problem of making connection without unduly complicated fabrication procedures remains largely unsolved.

Accordingly, an object of this invention is a semiconductor device including a substantially ohmic connection of negligible capacitance and low inductance to an extremely small active zone.

An ancillary object is to facilitate the fabrication of devices having extremely small active zones.

A more particular object of the invention is a semiconductor diode suitable for use in millimeter wave applications.

The invention, in a broad aspect, involves a semiconductor wafer having a dielectric coating on one face thereof. The dielectric coating contains an array of very small holes each of which defines an electrode to an underlying isolated active zone contiguous with the surface of the semiconductor wafer. Thus, each hole comprises a dimple in the dielectric coating with a metal electrode or surface at the bottom of the dimple which is in contact with the active zone of the device. Substantially ohmic contact to only one of the very small electrodes is provided by a single pointed wire resting in one of the dimples and in contact with the electrode at the bottom of the dimple. However, it is within the contemplation of this invention to use more than one wire connector, each of which contacts only one separate electrode.

In the case of a semiconductor diode, the active zone defined by each hole through the dielectric coating usually comprises a rectifying barrier, and often is of the PN junction type. In particular, such barriers may be formed in a variety of ways including solid state diffusion, metal plating to form Schottky-type barriers, or alloying.

Further in the case of diodes, the second electrical connection is formed by a large area contact to another portion of the wafer.

A particular feature is the provision of a large number of active zones, close packed, defined by holes in a surface coating which enables facile connection by means of a pointed wire to one active zone, the use of such a wire connector adding negligible capacitance to the circuit.

In particular, positioning of the wire connector may be made without the usual close visual observation under magnification.

Figure 2:
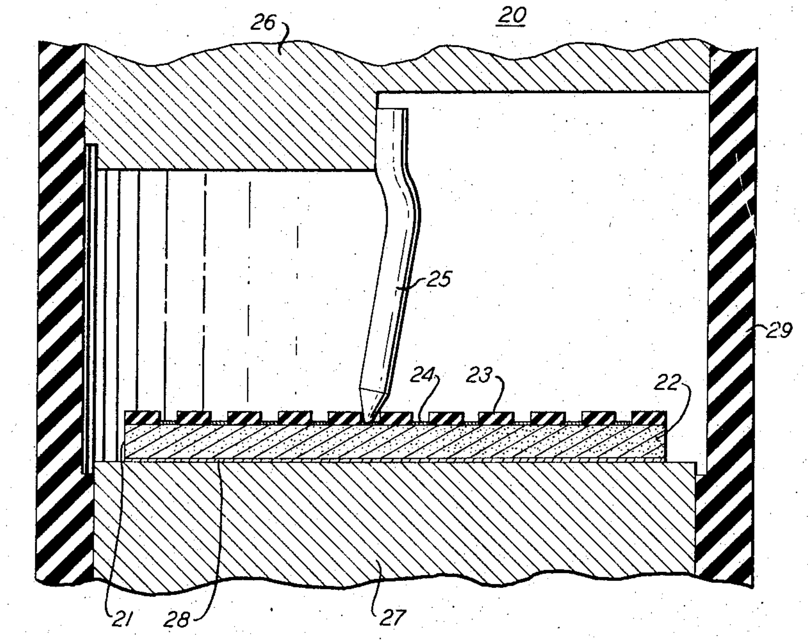

The invention and its other objects and features will be more clearly understood from the following more detailed description taken in conjunction with the drawing in which:

FIG. 1 is a plan view of a semiconductor wafer with an array of small holes formed in a dielectric coating on the surface thereof, and FIG. 2 shows, in section, a device in accordance with this invention comprising the oxide-masked wafer of FIG. 1 and a point contact in a portion of an encapsulation.

An embodiment in accordance with the invention will be described, at least in part, in terms of the method used to make it. Although the method and apparatus will be described in terms of a single wafer, it will be understood that the processing described is customarily done on an entire slice of semiconductor material which may be one-half inch or more in diameter. The slice then is divided into small wafers which may be about 20 x 20 mils. However, the following description will be given in terms of a single wafer.

Referring to FIG. 1 the assembly 10 comprises a wafer 11 of silicon semiconductor material. This material customarily is monocrystalline and formed in part by epitaxial vapor deposition. On one surface of the silicon wafer 11 a dielectric coating 12 of silicon oxide is formed by any one of several well-known techniques. Presently it is well known to form oxide coatings by various oxidation techniques or by evaporation deposition. An array of small holes 13 is made in the coating 12 by the photoresist technique which also is well known. Thus, in a small 20 x 20 mil semiconductor wafer several hundred openings exposing the silicon surface are provided by the dielectric mask.

In one particular embodiment the mask consists of a silicon-oxide coating having a thickness of about 0.4 micron. The holes produced in the mask by the resist technique are 5 microns in diameter and are located on 20 micron centers.

The opposite surface of wafer 11 then is masked and the wafer is immersed in an electroplating bath. A thin layer, typically of gold, is deposited by electroplating on the exposed silicon areas defined by the array of holes 13.

Referring to FIG. 2 the semiconductor element 21 comprises the silicon substrate 22, the oxide mask 23, and the plurality of barrier electrodes 24 on the silicon surface defined by the holes in the oxide mask. This is an extension of the element 10 described above in connection with FIG. 1. Electrical contact to one side of the diode is provided by the metal plating 28 bonding the element 21 to the metal header or plug 27 which is housed in one end of the insulating sleeve 29.

The more difficult connection to one of the very small active areas 24 on the oxide masked surface of the wafer is provided facilely by the sharp pointed wire 25 resting within one of the dimples and against the plated electrode. In particular, the placing of this pointed wire against the electrode on the wafer surface is facilitated by the dimpled array provided by the oxide mask within which only a single contact is required to produce a diode.

Typically, the wire 25 and its supporting metal terminal member 26, to which it is affixed, need only be brought into contacting relation to enable the point to locate itself within one of the dimples. In particular, the wire may be of about one mil diameter or less and of gold. The point of the wire suitably is electrolytically pointed using a standard electrode etching solution.

Under certain circumstances this contact wire 25 may be placed without the close visual observation usually required for such fabrication. In some instances, a slight "sliding about" of the wire end is sufficient to insure its positioning in one of the holes in the oxide.

It is apparent from the illustration that a wire point contact of the type shown as substantially no parasitic capacitance to the diode structure. Moreover, the inductance is low because of the wire configuration required to maintain proper contact. In addition to the use of gold as the wire contacting member, other suitable materials may be selected. In this respect it is advantageous to avoid overly stiff and springy wire materials in order to avoid application of point pressures which may tend to cause excessive penetration.

Alternative embodiments may use other semiconductor materials including those now well-known in the art such as germanium and gallium arsenide and other compound semiconductors of the III–V and II–VI groups. Further, in alternative arrangements, instead of making a PN junction of the surface barrier or Schottky-type as the active zone, the masked wafer having the exposed array of holes may be treated to a gaseous solid state diffusion using an impurity of a conductivity type opposite to that of the wafer material to form a PN junction. Typically, for high frequency devices the depth of diffusion will be extremely thin. Following this diffusion the semiconductor surfaces exposed within the holes are lightly plated with a metal to provide suitable ohmic electrodes. Contact to these electrodes likewise is made by means of the pointed wire as described above.

Another alternative technique for making the Schottky barrier type of device is disclosed in the application of D. Kahng and M. P. Lepselter, Ser. No. 355,663 filed Mar. 30, 1964, now Patent 3,290,127, issued Dec. 6, 1966 and assigned to the same assignee as this application. In accordance with the procedure disclosed therein the barrier layer comprises a palladium silicide layer to which ohmic connection may be made using the wire connector as disclosed herein, without the provision of an additional metal electrode layer.

Moreover, although silicon oxide has been disclosed as an advantageous dielectric masking coating, it is within the contemplation of this invention to use other suitable coatings including organic materials. In particular, using silicon oxide as the coating, holes of about 3 microns in diameter are now within the capability of the art.

Other alternatives for fabricating small active portions in the surfaces of semiconductor bodies include shallow surface alloying as well as other surface treatments. In particular, active regions may comprise structures not including conventional PN junctions but which have been treated so as to exhibit responses such as the "Gunn effect" or the like. The formation of such active zones by various techniques is not a part of this invention. Rather, it is in accordance with this invention to enable facile contact to such small active portions by means which contribute negligible capacitance and little inductance to the device characteristics. Accordingly, other arrangements may be devised by those skilled in the art which likewise fall within the scope and spirit of this invention.

What is claimed is:

1. The method of making a semiconductor device useful for microwave applications which comprises the steps of:

(a) forming a layer of electrically insulating material on one side of a semiconductor wafer;

(b) making an array of holes of approximately equal size in the insulating layer, each of said holes being of the order of 5 microns in diameter, thereby exposing the semiconductor at the bottom of each of the holes;

(c) forming a region including a rectifying barrier with an ohmic electrode on the surface of the semiconductor wafer at the bottom of each of substantially all of said holes;

(d) randomly sliding a wire, provided with a point which is somewhat smaller than said holes, across the surface of the insulating layer, until the point of the wire makes contact with the ohmic electrode in any one of the holes, thereby furnishing external electrical contact to said region; and, (e) securing said wire in connected position.

2. The method of claim 1 in which the semiconductor is silicon and the ohmic electrode is palladium silicide.

3. The method of claim 1 including the additional step of bonding the side of the semiconductor wafer opposite the array of holes to a metal header.

4. The method of making a semiconductor device useful for microwave applications which comprises (a) forming a layer of electrically insulating material on one side of a semiconductor wafer;

(b) making an array of holes of approximately equal size in the insulating layer, each of said holes being between about 3 microns about 5 microns in diameter, thereby exposing the semiconductor at the bottom of each of the holes;

(c) forming a region including a rectifying barrier with an ohmic electrode on the surface of the semiconductor wafer at the bottom of each of substantially all of said holes, (d) randomly sliding a wire, provided with a point which is somewhat smaller than said holes, across the surface of the insulating layer, until the point of the wire makes contact with the ohmic electrode in any one of the holes, thereby furnishing external electrical contact to said region; and (e) securing said wire in connected position.

5. The method of making a semiconductor device useful for microwave applications which comprises the steps of:

(a) forming a layer of electrically insulating material on one side of a semiconductor wafer;

(b) making an array of holes of approximately equal size in the insulating layer, each of said holes being about 5 microns in diameter and the distance between neighboring holes being about 20 microns, thereby exposing the semiconductor at the bottom of each of the holes;

(c) forming a region including a rectifying barrier with an ohmic electrode on the surface of the semiconductor wafer at the bottom of each of substantially all of said holes;

(d) randomly sliding a wire, provided with a point which is somewhat smaller than said holes, across the surface of the insulating layer, until the point of the wire makes contact with the ohmic electrode in any one of the holes, thereby furnishing external electrical contact to said region; and, (e) securing said wire in connected position.

6. The method of claim 5 in which the step of making the array of holes produces of the order of several hundred holes.

References Cited

UNITED STATES PATENTS

| | | | |
|---|---|---|---|
| 3,025,589 | 3/1962 | Hoerni | 29—25.3 |
| 3,178,796 | 4/1965 | Smits | 29—25.3 |
| 3,189,801 | 6/1965 | Uhlir | 317—236 |
| 2,680,220 | 6/1964 | Starr et al. | 317—235 |

JOHN W. HUCKERT, *Primary Examiner.*

JAMES D. KALLAM, *Examiner.*

M. H. EDLOW, *Assistant Examiner.*